(12) United States Patent
Park

(10) Patent No.: US 7,812,381 B2
(45) Date of Patent: Oct. 12, 2010

(54) IMAGE SENSOR WITH LIGHT RECEIVING REGION HAVING DIFFERENT POTENTIAL ENERGY ACCORDING TO WAVELENGTH OF LIGHT AND ELECTRONIC PRODUCT EMPLOYING THE SAME

(75) Inventor: Young-Hoon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/428,758

(22) Filed: Apr. 23, 2009

(65) Prior Publication Data

US 2009/0200591 A1     Aug. 13, 2009

Related U.S. Application Data

(63) Continuation-in-part of application No. 11/335,405, filed on Jan. 19, 2006, now Pat. No. 7,531,857.

(30) Foreign Application Priority Data

Jan. 24, 2005 (KR) ...................... 10-2005-0006371

(51) Int. Cl.
*H01L 31/062* (2006.01)
*H01L 31/113* (2006.01)
(52) U.S. Cl. ..................... 257/291; 257/292; 257/440
(58) Field of Classification Search ................ 257/233, 257/234, 291, 292, 294, 440
See application file for complete search history.

(56) References Cited

U.S. PATENT DOCUMENTS 6,756,616 B2   6/2004   Rhodes (Continued)

FOREIGN PATENT DOCUMENTS

JP    2004-146764    5/2004

(Continued)

OTHER PUBLICATIONS

"Image Sensor with Buried Barrier Layer Having Different Thickness According to Wavelength of Light and Method of Forming the Same", Specification, Drawings, and Prosecution History, of U.S. Appl. No. 11/335,405, filed Jan. 19, 2006 (Patent No. 7,531,857, scheduled to issue May 12, 2009), by Young-Hoon Park, which is stored in the United States Patent and Trademark Office (USPTO) Image File Wrapper (IFW) system.

*Primary Examiner*—Thien F Tran
(74) *Attorney, Agent, or Firm*—Mills & Onello, LLP

(57) ABSTRACT

There is provided a CMOS image sensor and an electronic product using the same. The CMOS image sensor includes a plurality of pixels for embodying colors having different wavelengths. Each of pixels includes a buried barrier layer disposed in a semiconductor substrate and having a barrier potential energy of a conduction band thereof at an equilibrium state, a first layer disposed at a main surface of the semiconductor substrate separated from the buried barrier layer in a vertical direction and having a first potential energy of a conduction band thereof at the equilibrium state, and a second layer disposed between the first region and the buried barrier layer having a second potential energy of a conduction band thereof at the equilibrium state. The second potential energy is higher than the first potential energy and the barrier potential energy and a thickness of the second layer is thicker as the wavelength is longer.

20 Claims, 13 Drawing Sheets

U.S. PATENT DOCUMENTS

| | | |
|---|---|---|
| 7,423,305 B2 * | 9/2008 | Shinohara et al. ........... 257/292 |
| 7,531,857 B2 | 5/2009 | Park |
| 2004/0080638 A1 | 4/2004 | Lee |
| 2006/0163618 A1 | 7/2006 | Park |

FOREIGN PATENT DOCUMENTS

| | | |
|---|---|---|
| KR | 10-0390823 | 6/2003 |
| KR | 10-2004-0036087 | 4/2004 |

* cited by examiner

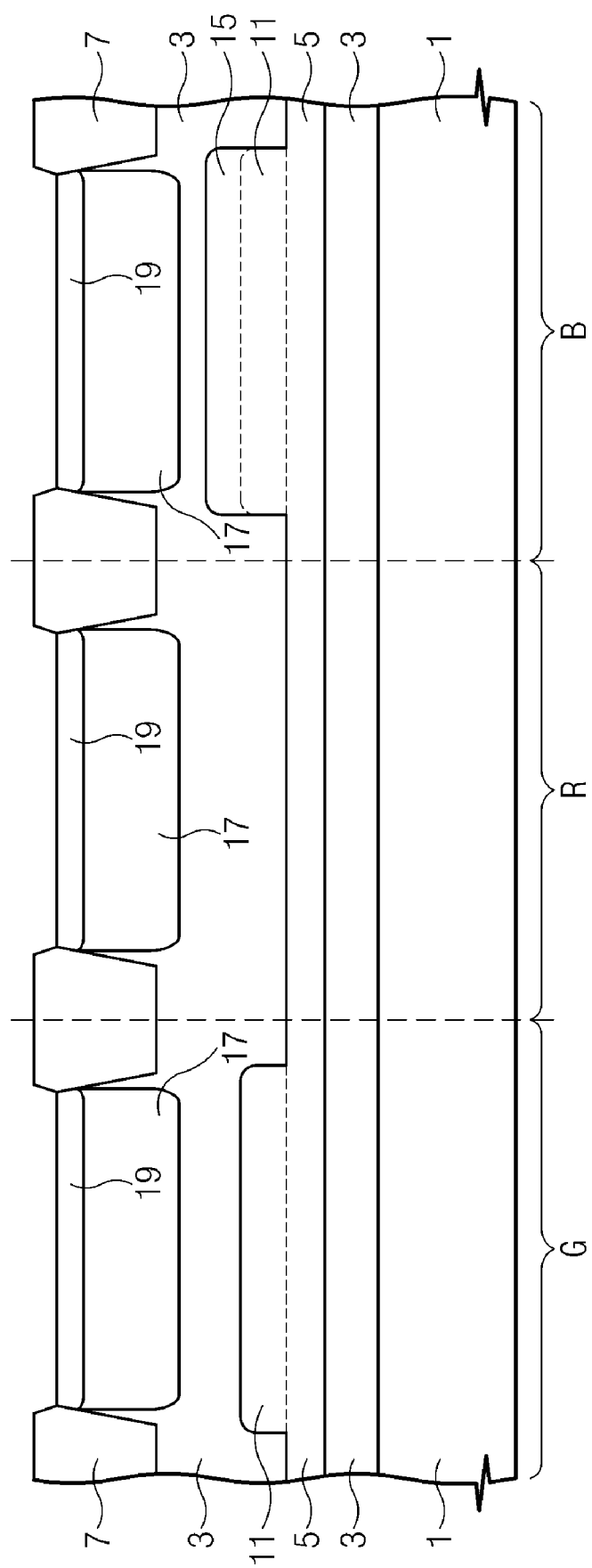

US 7,812,381 B2

IMAGE SENSOR WITH LIGHT RECEIVING REGION HAVING DIFFERENT POTENTIAL ENERGY ACCORDING TO WAVELENGTH OF LIGHT AND ELECTRONIC PRODUCT EMPLOYING THE SAME

CROSS-REFERENCE TO RELATED APPLICATIONS

This application is a continuation-in-part of U.S. patent application Ser. No. 11/335,405, filed Jan. 19, 2006, which claims the priority of Korean Patent Application No. 10-2005-0006371, filed Jan. 24, 2005 in the Korean Intellectual Property Office, the contents of which applications are herein incorporated by reference in their entirety.

BACKGROUND OF THE INVENTION

1. Field of the Invention

Example embodiments relate to an image sensor and, more particularly, to an image sensor with a light receiving region having different potential energy according to a wavelength of light and an electronic product employing the same.

2. Description of Related Art

Image sensors convert optical images to electric signals. Image sensors are typically classified as complementary Metal-Oxide-Silicon (CMOS) image sensors or charge-coupled device (CCD) image sensors. The CCD image sensor has superior photo sensitivity and noise characteristics compared to the CMOS image sensor. However, it is difficult and complicated to highly integrate the CCD image sensor, and the CCD image sensor consumes a large amount electric power compared to the CMOS image sensor. On the contrary, the CMOS image sensor is manufactured by a simpler manufacturing process compared to the CCD image sensor and the CMOS image sensor is suitable to be highly integrated. Also, the CMOS image sensor consumes less electric power than the CCD image sensor.

According to dramatic development of semiconductor manufacturing technology, a CMOS image sensor manufacturing technology has also rapidly developed, and characteristics of the CMOS image sensor have improved.

Conventionally, a pixel of the CMOS image sensor includes a plurality of photodiodes for receiving light and CMOS elements for controlling image signals inputted from the photodiodes. The photodiode generates an electron-hole pair according to wavelength and intensity of red, green, or blue light incident through color filters, and outputs signals varied according to a quantity of the generated electrons. That is, the CMOS image sensor detects images based on a variation of the signal outputted from the photodiodes.

The photodiode includes two impurity implantation regions doped with different impurities. Theses impurity implantation regions of the photodiode are formed to have identical range of projection (Rp). A penetration depth of light is varied according to the wavelength of the light. That is, higher wavelength of the light is penetrated deeper than shorter wavelength. However, an absorption coefficient in a silicon layer decreases in reverse proportion to the wavelength of the light. Since a red light has a longer wavelength than green light and blue light, the absorption coefficient of the red light is lower than the green and the blue light. Accordingly, the image sensor may have difficulty detecting the red signal and have unevenness of color detection ratio. The penetration depths of the green light and the blue light are limited within a photodiode region. Therefore, the photodiodes output stable image signals of the green and the blue light. However, since the wavelength of the red light is longer and the penetration depth of the red light is deeper, the red light may penetrate deeper than the photodiode region. Accordingly, if an electron-hole pair is generated outside of the photodiode region, the generated electron causes cross-talk since the generated electron moves to a photodiode region of a neighboring pixel.

SUMMARY OF THE INVENTION

Accordingly, an example embodiment is directed to an image sensor including a buried barrier layer having different thicknesses according to a wavelength of light and a method of forming the same that substantially obviates one or more problems due to limitations and disadvantages of the related art.

It is a feature of the example embodiment to provide a CMOS image sensor preventing cross-talk of red light and a method of manufacturing the same.

It is another feature of the example embodiment to provide a CMOS image sensor having high sensitivity and a method of manufacturing the same.

Additional advantages and features of the example embodiments of the invention will be set forth in part in the description which follows and in part will become apparent to those having ordinary skill in the art upon examination of the following or may be learned from practice of the example embodiments of the invention. The objectives and other advantages of the example embodiments of the invention may be realized and attained by the structure particularly pointed out in the written description and claims hereof as well as the appended drawings.

In one aspect, there is provided a CMOS image sensor including a plurality of pixels associated with colors of different wavelengths, wherein each of the pixels has: a photoelectric conversion unit; and a buried barrier layer arranged below the photoelectric conversion unit, wherein a thickness of the buried barrier layer is different according to the different wavelengths.

The photoelectric conversion unit may include: a first impurity implantation region of a first type; and a second impurity implantation region of a second type arranged under the first impurity implantation region, wherein the buried barrier layer is doped with impurities of the first type.

The buried barrier layer may be separated from the second impurity implantation region.

A thickness of the buried barrier layer may be thinner as the wavelength is longer.

In another aspect, there is provided a CMOS image sensor having a first pixel associated with a red color, a second pixel associated with a green color and a third pixel associated with a blue color, wherein each of pixels includes: a semiconductor substrate of a first type; an epitaxial layer of a first type on the semiconductor substrate; a photoelectric conversion unit arranged on the epitaxial layer; and a first buried barrier layer below the photoelectric conversion unit in the epitaxial layer, wherein the second pixel and the third pixel further include a second buried barrier layer on the first buried barrier layer.

The photoelectric conversion unit may include a first impurity implantation region of a first type and a second impurity implantation region of a second type under the first impurity implantation region, wherein the first buried barrier layer and the second buried barrier layer are doped with impurities of the first type.

A concentration of impurity doped on the first buried barrier layer may be identical to a concentration of an impurity doped on the second buried barrier layer, and is higher than a concentration of impurity doped on the epitaxial layer. Also, the second buried barrier layer is separated from the second impurity implantation region.

The third pixel further may include a third buried barrier layer formed on the second buried barrier layer, wherein the third buried barrier layer is doped with impurity having a concentration and a type the same as those of an impurity doped on the first buried barrier layer.

The third buried barrier layer may be separated from the second impurity implantation region.

Each of the pixels of the CMOS image sensor may further include: an isolation layer arranged on the epitaxial layer for isolating each of pixels; an interlayer insulation layer covering the epitaxial layer and the isolation layer; a planarization layer on the interlayer insulation layer; a color filter arranged on the planarization layer associated with each of colors corresponding to each of the pixels; and a micro lens on the color filter.

According to another aspect, an example embodiment of the invention is directed to a method of manufacturing a CMOS image sensor having pixels associated with colors of different wavelengths. According to the method, an epitaxial layer of a first type is formed on a semiconductor substrate of the first type. A first buried barrier layer is formed in the epitaxial layer of the first type. A photoelectric conversion unit is formed on the buried barrier layer. Herein, the thickness of the buried barrier layer is different according to the different wavelengths.

In one embodiment, the buried barrier layer is formed by doping a first type impurity to have a higher concentration than the epitaxial layer.

The forming of the photoelectric conversion may comprise: forming a second impurity implantation region of a second type at an upper part of the epitaxial layer; and forming a first impurity implantation region of a first type on the second type of the second impurity implantation region. The second impurity implantation region is formed to be separated from the buried barrier layer.

In one embodiment, the buried barrier layer is formed to have a thinner thickness as the wavelength is longer.

According to another aspect, an example embodiment of the invention is directed to a method of manufacturing a CMOS image sensor having a first pixel associated with a red color, a second pixel associated with a green color and a third pixel associated with a blue color, the method including: forming an epitaxial layer of a first type on a semiconductor substrate of the first type; forming a first buried barrier layer in the epitaxial layer of the first type by performing an ion implantation process; forming an isolation layer for isolating the pixels; forming a first mask covering the epitaxial layer of the first pixel; forming a second buried barrier layer on the first buried barrier layer on the second pixel and the third pixel by performing an ion implantation process using the first mask; and forming a photoelectric conversion unit on the epitaxial layer.

The first buried barrier layer and the second buried barrier layer may be formed by doping a first type impurity having the same concentration, but the concentration of the impurity doped on the first buried barrier layer and the second buried barrier layer is higher than a concentration of impurity doped on the epitaxial layer.

Forming the photoelectric conversion unit may include: forming a second impurity implantation region of a second type on the epitaxial layer; and forming a first impurity implantation region of the first type on the second impurity implantation region, wherein the second impurity implantation region is formed to be separated from the second buried barrier layer.

The method may further include before the forming the photoelectric conversion unit; forming a second mask covering the epitaxial layer of the first pixel and the second pixel; and forming a third buried barrier layer on the second buried barrier layer of the third pixel using the second mask as an ion implantation mask, wherein the third buried barrier layer is formed by doping impurities having a concentration and a type identical to impurities doped on the second buried barrier layer.

Forming of the first buried barrier layer may include doping impurities of a first type with an energy higher than 1.4 MeV, forming the second buried barrier layer may include doping impurities of the first type with energies ranging from 1.0 MeV to 1.4 MeV, and forming the third buried barrier layer may include doping impurities of the first type with energies ranging from 0.6 MeV to 1.0 MeV.

According to another aspect, a CMOS image sensor includes a plurality of pixels associated with colors of different wavelengths. Each of the pixels includes a buried barrier layer disposed in a semiconductor substrate. The buried barrier layer has a barrier potential energy of a conduction band thereof at an equilibrium state. Each of the pixels further includes a first layer disposed at a main surface of the semiconductor substrate and separated from the buried barrier layer in a vertical direction which is perpendicular to the main surface of the semiconductor substrate. The first layer has a first potential energy of a conduction band thereof at the equilibrium state. Each of the pixels further includes a second layer disposed between the first region and the buried barrier layer. The second layer has a second potential energy of a conduction band thereof at the equilibrium state. The second potential energy is higher than the first potential energy and the barrier potential energy, and each of the first and second layers has a thickness in the vertical direction, and the thickness of the second layer is thicker as the wavelength is longer.

In one embodiment, the first layer includes a first impurity layer of a first conductivity type, the second layer includes a second impurity layer of a second conductivity type, and the buried barrier layer is of the first conductivity type. In another embodiment, the first impurity layer and the second impurity layer constitute a photo diode. In another embodiment, the thickness of the second impurity layer is thicker as the wavelength is longer. In another embodiment, the first and second conductivity types are P-type and N-type, respectively. In another embodiment, the second layer further comprises a buffer layer between the second impurity layer and the buried barrier layer, and the buffer layer is of the first conductivity type. In another embodiment, an impurity concentration of the buffer layer is lower than that of the buried barrier layer. In another embodiment, the thickness of the second impurity layer is thicker as the wavelength is longer, while the thickness of the buffer layer has a constant value regardless of the wavelength. In another embodiment, the thickness of the buffer layer is thicker as the wavelength is longer, while the thickness of the second impurity layer has a constant value regardless of the wavelength.

According to another aspect, a CMOS image sensor includes a semiconductor substrate having a plurality of pixel regions and a single impurity layer in the semiconductor substrate. The single impurity layer includes a plurality of buried barrier layers which are disposed in the plurality of the pixel regions respectively. The CMOS image sensor further includes a plurality of photo diodes formed in the single impurity layer and located over the buried barrier layers respectively. Each of the photo diodes is separated from the corresponding buried barrier layer to leave a portion of the single impurity layer between the photo diode and the corresponding buried barrier layer. The single impurity layer in at least two adjacent pixel regions among the plurality of pixel regions has a non-uniform potential energy profile along a horizontal axis parallel to a main surface of the semiconductor substrate.

In one embodiment, the at least two adjacent pixel regions include a first pixel region and a second pixel region, and the horizontal axis passes through a portion of the single impurity layer of the first pixel region and the buried barrier layer of the second pixel region.

In one embodiment, each of the photo diodes includes a first impurity layer of a first conductivity type formed at the main surface of the semiconductor substrate and a second impurity layer of a second conductivity type disposed beneath the first impurity layer. In another embodiment, the first conductivity type and the second conductivity type are P-type and N-type, respectively. In another embodiment, the single impurity layer including the buried barrier layers is of the first conductivity type, and an impurity concentration of the buried barrier layers is higher than that of the portion of the single impurity layer. In one embodiment, the pixel regions include a first pixel region on which a first light is irradiated and a second pixel region on which a second light is irradiated, and a wavelength of the first light is longer than that of the second light. In another embodiment, a potential energy of the single impurity layer of the first pixel region is higher than a potential energy of the single impurity layer of the second pixel region. In another embodiment, the plurality of photo diodes have a same thickness in a vertical direction which is perpendicular to the main surface of the semiconductor substrate. In another embodiment, the single impurity layer in each of the pixel regions comprises a thickness in the vertical direction, and the thickness of the single impurity layer in the first pixel region is greater than the thickness of the single impurity layer in the second pixel region.

According to another aspect, an electronic product includes an image sensor module including an image sensor and a controller coupled to the image sensor module. The controller controls an operation of the image sensor module. The electronic product further includes an input/output module coupled to the controller. The input/output module provides input data regarding the operation of the image sensor module and displays output data from the image sensor module. The image sensor includes a buried barrier layer disposed in a semiconductor substrate. The buried barrier layer has a barrier potential energy of a conduction band thereof at an equilibrium state. The image sensor further includes a first layer disposed at a main surface of the semiconductor substrate and separated from the buried barrier layer in a vertical direction which is perpendicular to the main surface of the semiconductor substrate. The first layer has a first potential energy of a conduction band thereof at the equilibrium state. The image sensor further includes a second layer disposed between the first region and the buried barrier layer. The second layer has a second potential energy of a conduction band thereof at the equilibrium state. The second potential energy is higher than the first potential energy and the barrier potential energy, and each of the first and second layers has a thickness in the vertical direction, and the thickness of the second layer is thicker as the wavelength is longer.

According to another aspect, an electronic product includes an image sensor module including an image sensor and a controller coupled to the image sensor module. The controller controls an operation of the image sensor module. The electronic product further includes an input/output module coupled to the controller. The input/output module provides input data regarding the operation of the image sensor module and displays output data from the image sensor module. The image sensor includes a semiconductor substrate having a plurality of pixel regions and a single impurity layer in the semiconductor substrate. The single impurity layer includes a plurality of buried barrier layers which are disposed in the plurality of the pixel regions respectively. The image sensor further includes a plurality of photo diodes formed in the single impurity layer and located over the buried barrier layers respectively. Each of the photo diodes is separated from the corresponding buried barrier layer to leave a portion of the single impurity layer between the photo diode and the corresponding the buried barrier layer. The single impurity layer in at least two adjacent pixel regions among the plurality of pixel regions has a non-uniform potential energy profile along a horizontal axis parallel to a main surface of the semiconductor substrate.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 4 to 8 are cross sectional views illustrating a method of manufacturing a CMOS image sensor according to an embodiment of the present invention.

DETAILED DESCRIPTION OF THE EXEMPLARY EMBODIMENTS OF THE INVENTION

The present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

A photodiode represents a photoelectric conversion unit forming electric charge by incident light in the present embodiment.

Figure 1:
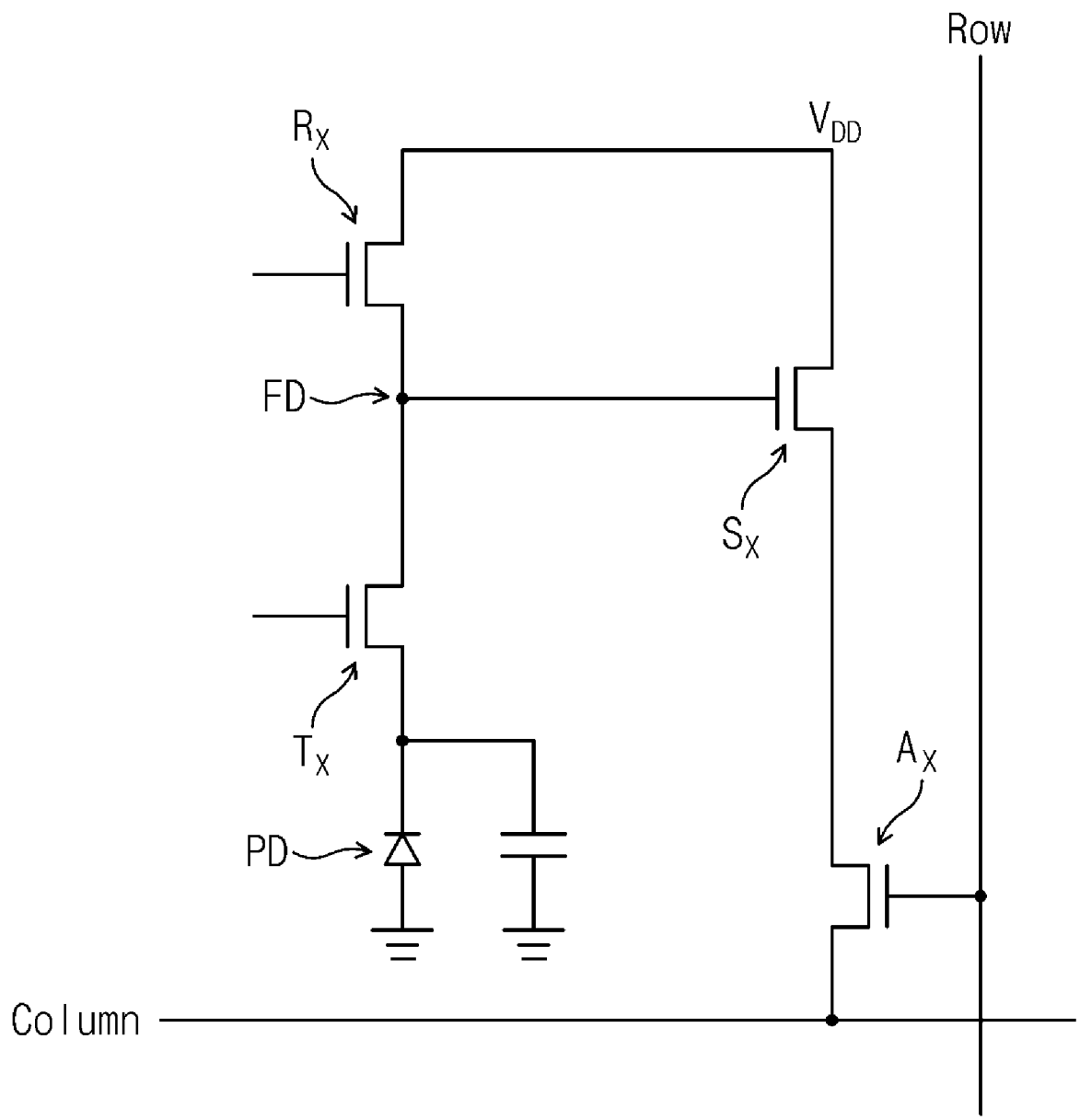
FIG. 1 is a schematic circuit diagram illustrating a CMOS image sensor according to an embodiment of the present invention.
Figure 2:
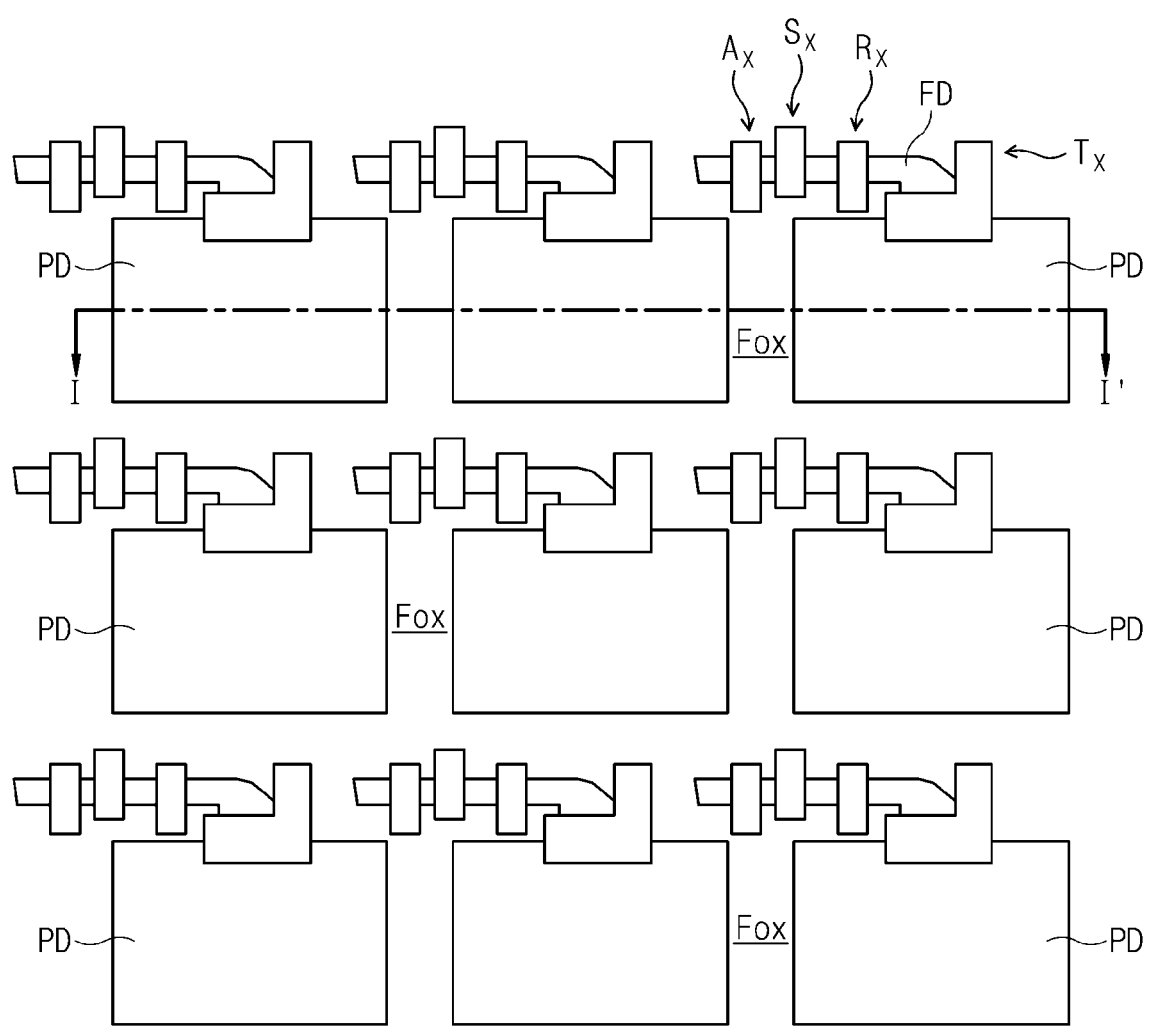
FIG. 2 is a schematic plan view of pixels of a CMOS image sensor according an embodiment of the present invention.

FIG. 1 is a schematic circuit diagram illustrating a CMOS image sensor, and FIG. 2 is a plan view of pixels of a CMOS image sensor according to an embodiment of the present invention.

Referring to FIGS. 1 and 2, the CMOS image sensor includes a plurality of unit pixels dielectrically isolated by an isolation layer $F_{ox}$. Each of the unit pixels includes a photodiode PD and four transistors Tx, Rx, Sx, Ax. A transfer transistor Tx is coupled at a longitudinal side of the photodiode PD. A reset transistor Rx, a select transistor Sx, and an access transistor Ax are sequentially arranged at one side of the transfer gate. A drain of the transfer transistor Tx, which is also a source of the reset transistor Rx, is called a floating diffusion area FD.

Operation of the CMOS image sensor will be described with reference to FIGS. 1 and 2. At first, a VDD is applied to the reset transistor Rx and the selection transistor Sx when light is intercepted, and a reference value is calculated by turning on all of four transistors or turning on three transistors excepting the transfer transistor. After turning on, the reset transistor Rx is turned off, and a light is irradiated to the photodiode PD which is a light receiving unit. As a result, the photodiode generates an electron-hole pair. If the transfer transistor Tx is turned on, the generated electric charge is transferred to the floating diffusion region FD. A gate bias of the selection transistor Sx is changed in proportion to an amount of the transferred electric charge. A variation range of electric potential of a source of the selection transistor Sx is eventually exceeded. If the access transistor Ax is turned on, a signal is read by the electric charge in a column side.

Figure 3:
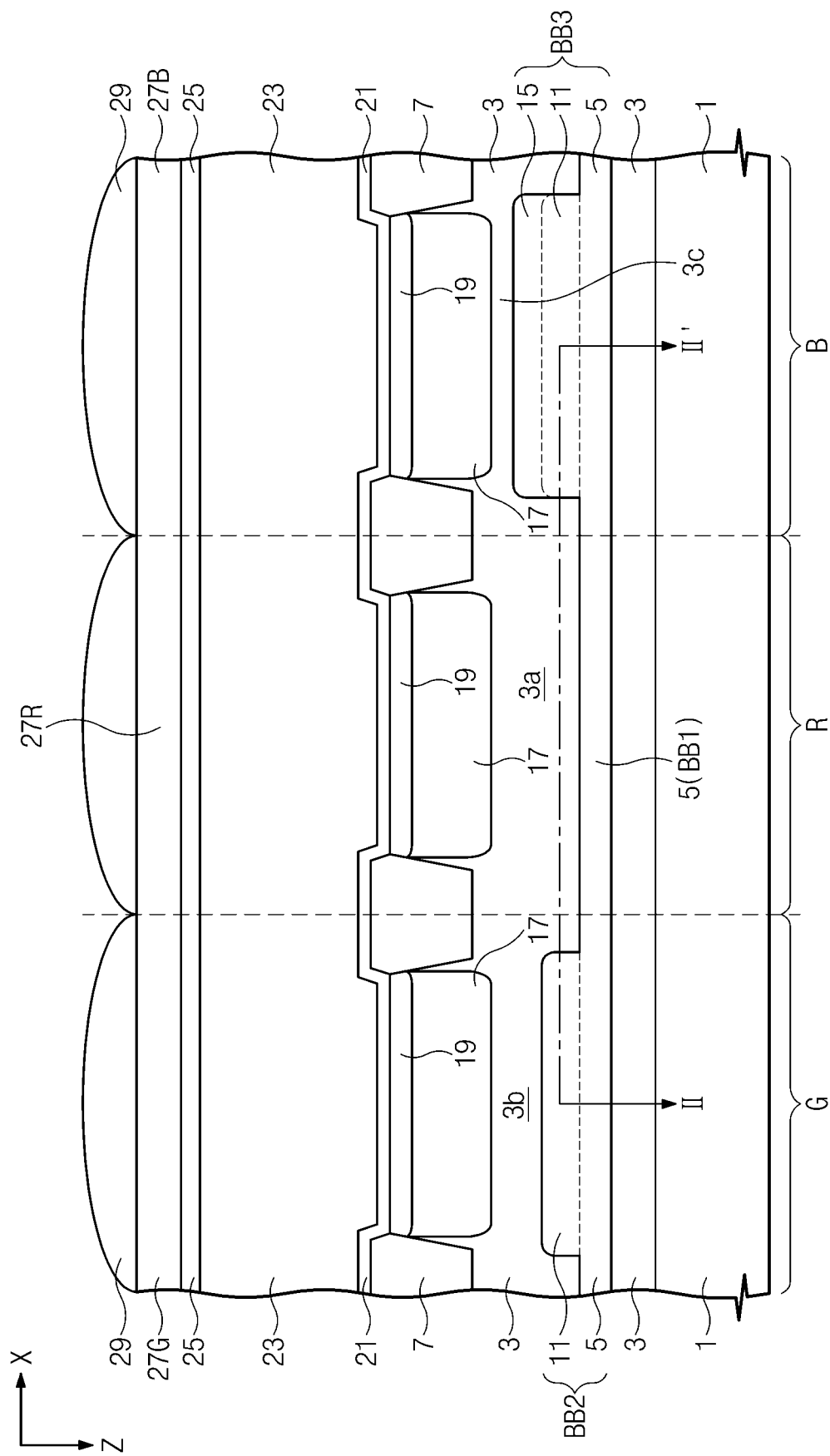
FIG. 3 is a cross sectional view of an image sensor according to an embodiment of the present invention which is obtained by cutting the image sensor shown in FIG. 2 along a line I-I'.

FIG. 3 is a cross sectional view obtained by cutting the image sensor shown in FIG. 2 along a line I-I'. That is, FIG. 3 shows a cross sectional view of an image sensor according to an embodiment of the present invention.

Referring to FIG. 3, a P-type epitaxial layer 3 is arranged on a P-type semiconductor substrate 1 having a green region (G) which is a pixel for embodying (being associated with) a green light, a red region (R) which is a pixel for embodying (being associated with) a red light, and a blue region (B) which is a pixel for embodying (being associated with) a blue light. Each of the regions G, R, B is isolated by the isolation layer 7. In the present embodiment, locations of the green region, the red region and the blue region are appropriately arranged for conveniently describing the present invention. Accordingly, the locations of the regions G, R, B may be varied. For example, the red region (R) is arranged in a center of a 3×3 arrangement formation, and the green region (G) may be arranged at a right side, a left side, an upper side or a bottom side of the red region (R). The blue region (B) may be arranged at a diagonal direction relative to the red region (R).

A first P-type impurity implantation region 19 and a second N-type impurity implantation region 17 are formed on the epitaxial layer 3 for forming a photodiode which is a light receiving unit. Also, the second N-type impurity implantation region 17 and the P type epitaxial layer may form a photoelectric conversion unit. A first buried barrier layer 5 is arranged below the second impurity implantation region 17 in the epitaxial layer 3. The first buried barrier layer 5 may be formed by doping a P-type impurity. A concentration of the impurity doped on the buried barrier layer 5 is higher than a concentration of impurity doped at the epitaxial layer 3. A second buried barrier layer 11 is formed on the first buried barrier layer 5 in the greed region G and the blue region B. A third buried barrier layer 15 is arranged on the first buried barrier layer 5 in the blue region B. The second buried barrier layer 11 and the third buried barrier layer 15 may be formed by doping P-type impurities. The concentration of the impurity doped on the second and the third buried barrier layer 11 and 15 is identical to the concentration of impurity doped on the first buried barrier layer 5. The second impurity implantation region 17 is separated from the buried barrier layer in each of regions. That is, the first buried barrier layer 5 is separated from the second impurity implantation region 17 in the red region (R). The third buried barrier layer 15 is separated from the second impurity implantation region 17 in the blue region (B).

In the present embodiment, a depletion region of a photodiode is controlled according to a wavelength of a light incident to each of regions in order to improve a sensitivity of the image sensor. As described above, a wavelength of blue light is shortest and a wavelength of red light is longest. Since the blue light reaches to an upper portion of the second impurity implantation region 17 in the blue region B, the sensitivity is not degraded although a width (depth) of the depletion region is not wider or deeper. Meanwhile, since the red light reaches to a bottom portion of the second impurity implantation region 17 in the red region (R), a depletion region having a wider width (or deeper depth) is required.

At the same time, crosstalk is prevented according to the present embodiment. That is, the buried barrier layers 5, 11, 15 block movements of electrons when an electron hole pair is generated by the red light passed through the second impurity implantation region 17 in the red region (R) to reach the epitaxial layer. That is, electrons moved in the buried barrier layers 5, 11, 15 are rejoined to holes and thus the crosstalk of adjacent pixels is prevented.

A high concentration P-type first impurity implantation region 19 may be formed on the second impurity implantation region 17 in each of regions. The first impurity implantation region 19 prevents movement of electrons generated on an unstable surface of the second impurity implantation region 17. That is, the electrons are rejoined with the holes to prevent, to suppress or to improve a dark current.

A reflection prevention layer 21, an interlayer insulation layer 23, and a planarization layer 25 may be sequentially formed on the epitaxial layer 3. For example, the reflection prevention layer 21 is formed of a nitride silicon oxide layer (SiON) or a silicon nitride layer ($Si_3N_4$). The interlayer insulation layer 23 is formed of a silicon oxide layer ($SiO_2$) or a fluorinated silicon oxide (SiOF). The planarization layer 25 may be formed of a nitride silicon oxide layer (SiON) or a silicon nitride layer ($Si_3N_4$). Color filters 27G, 27R, 27B are formed on the planarization layer 25 for embodying colors. That is, the green color filter 27G is arranged on the green region (G), the red color filter 27R is arranged on the red region (R), and the blue color filter 27B is arranged on the blue region (B). Each of the color filters 27G, 27R, 27B may be formed of colorants of corresponding colors. A micro lens is arranged on the color filters 27G, 27R, 27B to concentrate an incident light.

FIGS. 4 to 8 are diagrams illustrating a method of manufacturing a CMOS image sensor shown in FIG. 3 according to an embodiment of the present invention.

Figure 4:
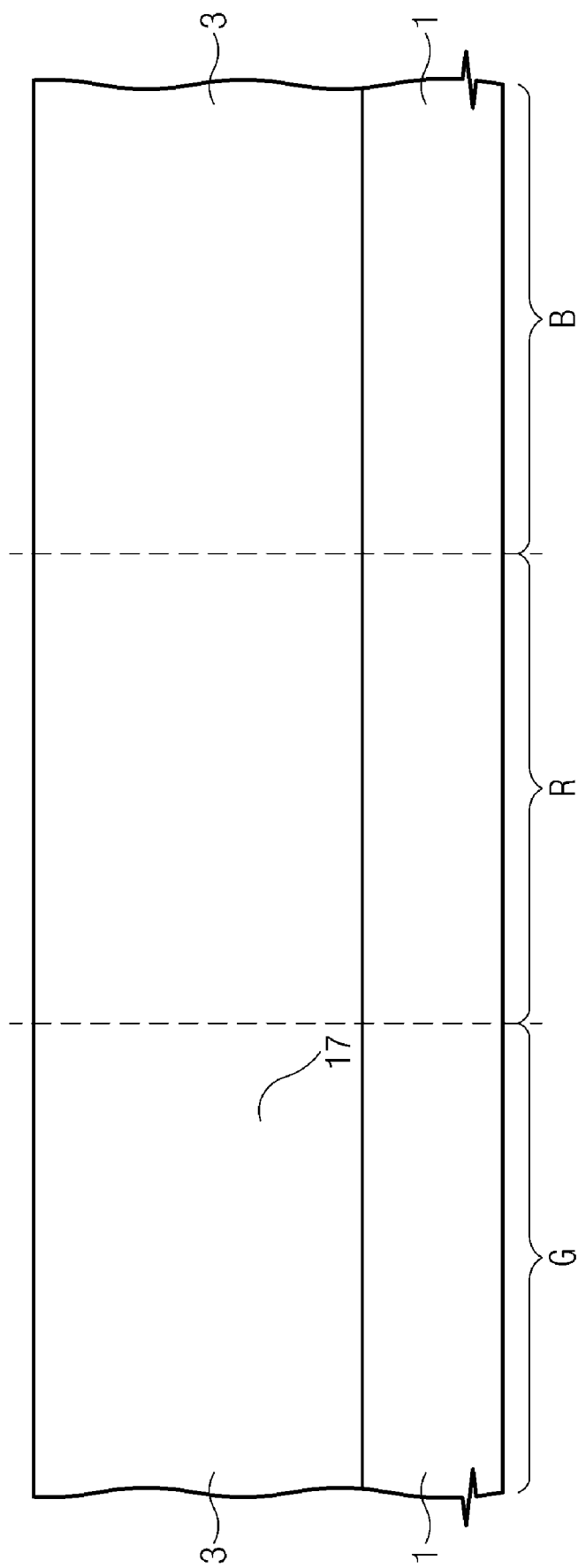

Referring to FIG. 4, a P-type epitaxial layer 3 is formed on a P-type semiconductor substrate 1 having a green region (G) which is a pixel for embodying a green light, a red region (R) which is a pixel for embodying a red light and a blue region (B) which is a pixel for embodying a blue light. Boron (B)

may be doped while forming the epitaxial layer 3. A dose of the boron may be $1\times10^{10}$ atoms/cm$^2$.

Figure 5:
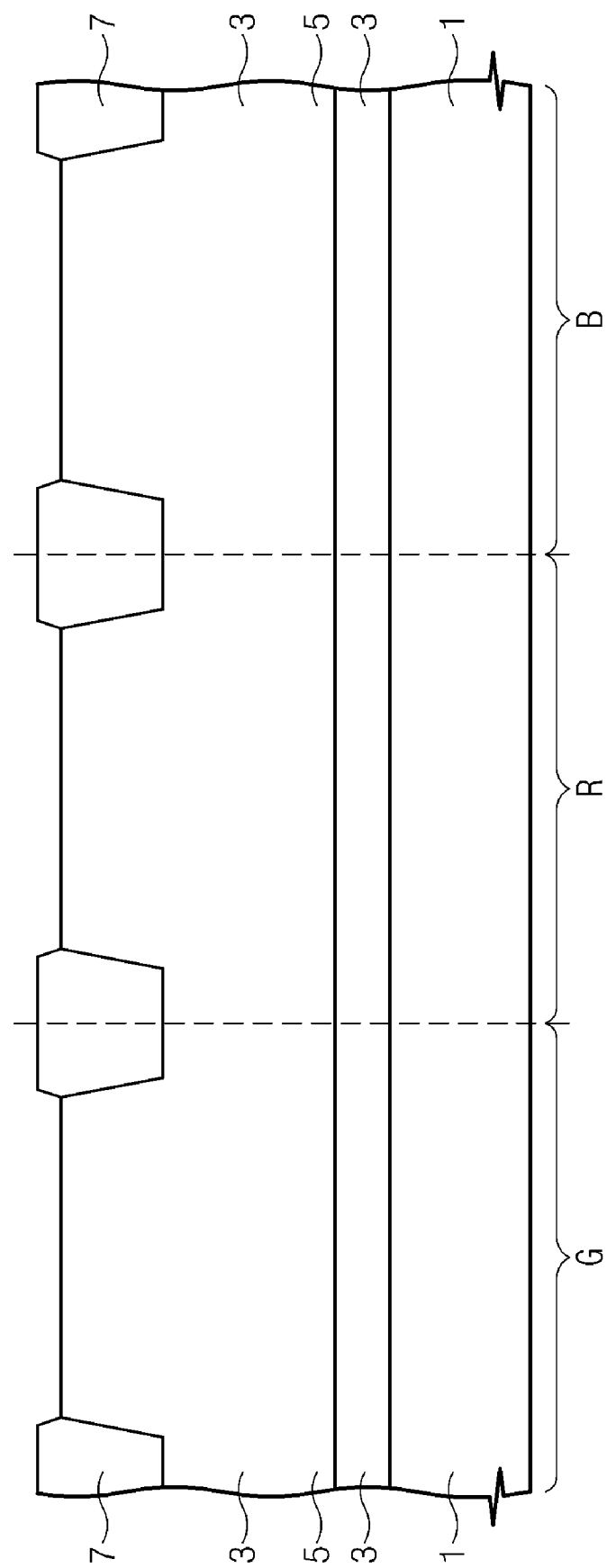

Referring to FIG. 5, a P-type first buried barrier layer 5 is formed in the epitaxial layer 3 by performing an ion implantation process. For example, the first buried barrier layer 5 may be formed by doping $1\times10^{10}$ atoms/cm$^2$ of boron with energy higher than 1.4 MeV. An isolation layer 7 is formed on the epitaxial layer 3 by using a shallow trench isolation (STI) method.

Figure 6:
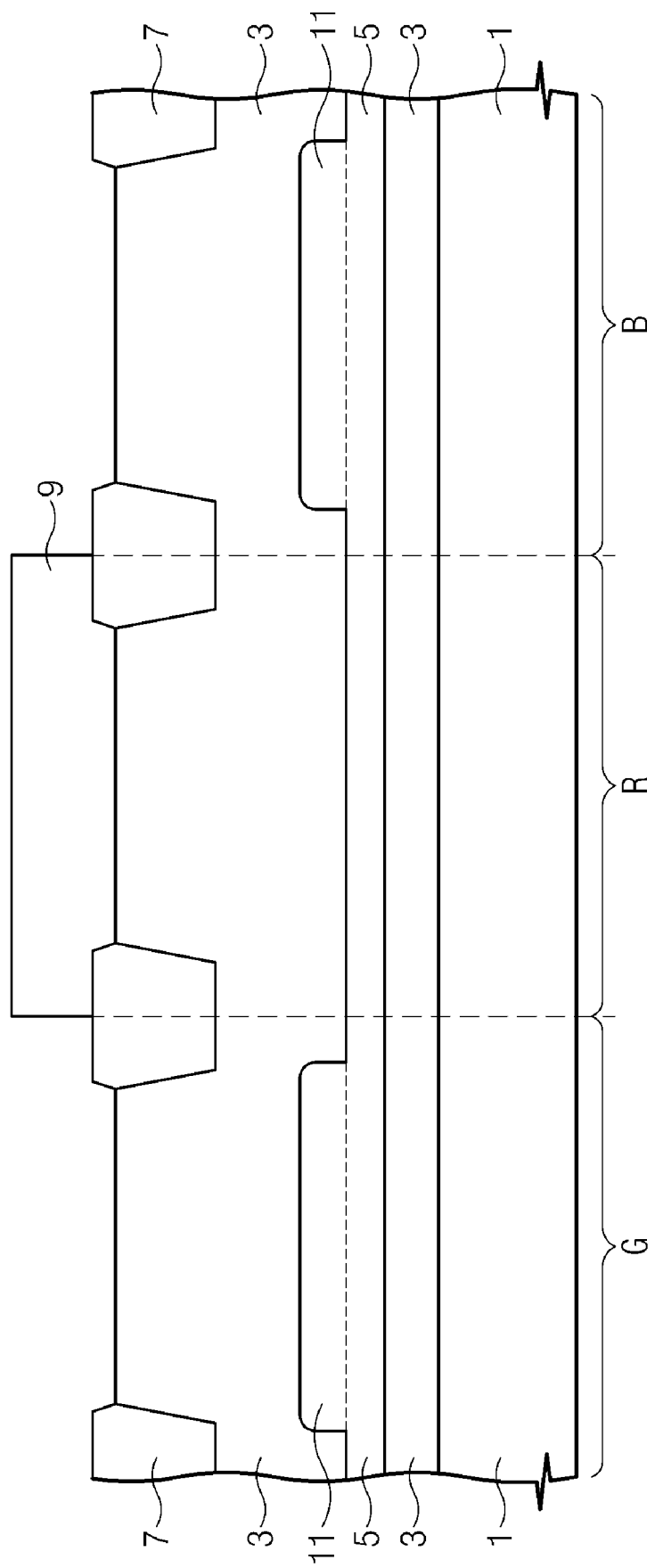

Referring to FIG. 6, a first mask 9 is formed to cover the red region (R). For example, the first mask 9 is a photo resistant pattern. A second buried barrier layer 11 is formed on the first buried barrier layer 5 in the green region (G) and the blue region (B) using the first mask 9 and the isolation layer 7 as an ion implantation mask. For example, the second buried barrier layer 11 may be formed by doping boron with energies ranging from 1.0 MeV to 1.4 MeV, where the dose of the boron is $1\times10^{12}$ atoms/cm$^2$. The second buried barrier layer 11 may be coupled to the first buried barrier layer by a succeeding thermal process.

Figure 7:
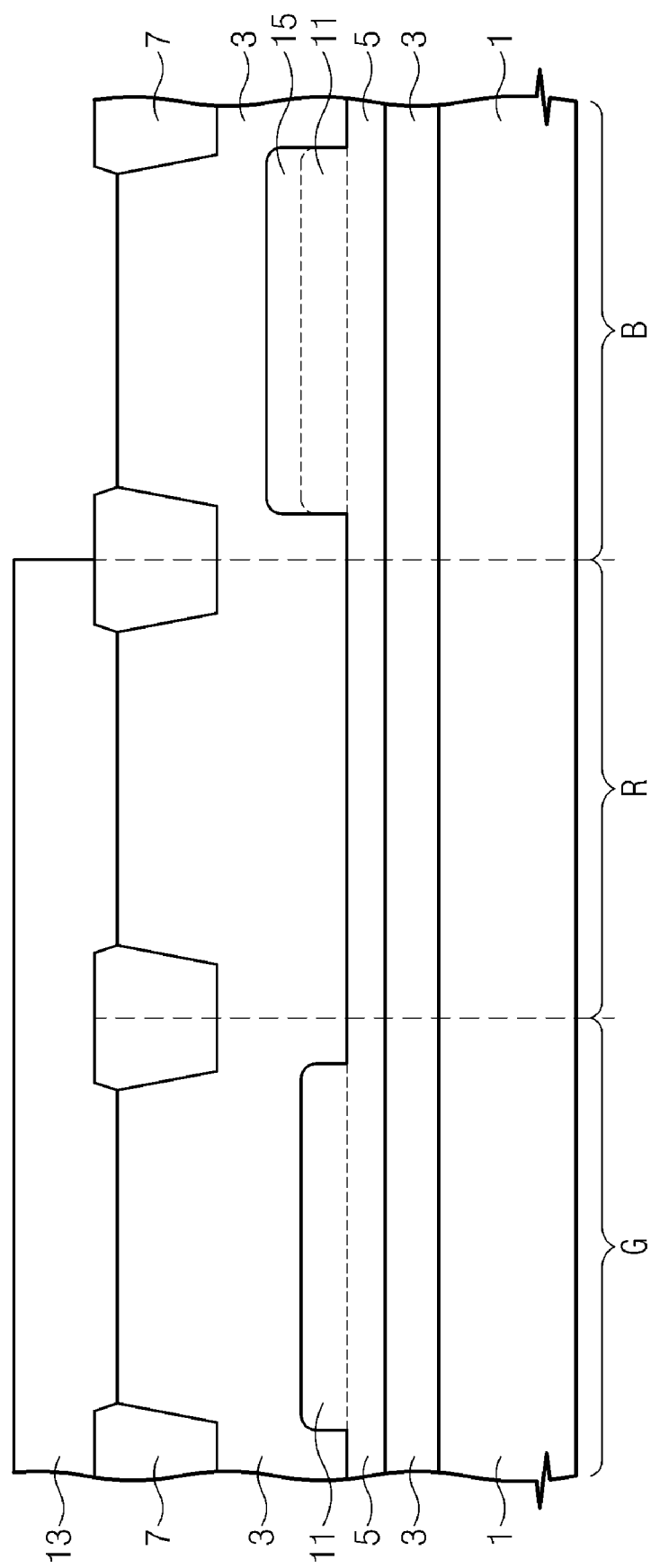

Referring to FIG. 7, a second mask 13 is formed to cover the green region (G) and the red region (R) after eliminating the first mask 9. A third buried barrier layer 15 is formed on the blue region (B) using the second mask 13 and the isolation layer 7 as an ion implantation mask. The third buried barrier layer 15 is formed by doping boron with energies ranging from 0.6 MeV to 1.0 MeV, where the dose of the boron is $1\times10^{10}$ atoms/cm$^2$. The third buried barrier layer 15 may be coupled to the second buried barrier layer 11 by succeeding thermal process.

Referring to FIGS. 8 and 2, the second mask 13 is eliminated. A gate oxide layer (not shown) is formed by performing a thermal process, and gate electrodes are formed to form transistors shown in FIG. 2. An ion implantation process is performed using the isolation layer 7 and the gate electrode as an ion implantation mask. And, a P-type first impurity implantation region 19 may be formed on the second impurity implantation region 17 by performing an ion implantation process. The ion implantation processes are performed to form source/drain regions of the transistors.

Referring to FIG. 3, the reflection prevention layer 21, the interlayer insulation layer 23 and the planarization layer 25, color filters 27G, 27R, 27B and a micro lens 29 are sequentially formed to completely form the image sensor shown in FIG. 3.

After performing each of the ion implantation processes, a plurality of thermal processes (not shown) may be performed. Alternatively, single terminal process may be performed after completely performing the ion implantation processes.

As described above, the buried barrier layers are formed below the photodiode in the image sensor according to the present invention. The thicknesses of the buried barrier layers are differently formed according to wavelengths of the incident lights. Accordingly, the buried barrier layers prevent the electric charge, which is generated by an incident light having longer wavelengths such as a red light, from moving to a photodiode region of the adjacent pixel. Therefore, crosstalk is prevented.

Furthermore, sensitivity of the image sensor may be improved by differently forming a thickness of a depletion layer according to a wavelength of the incident light.

Figure 9A:
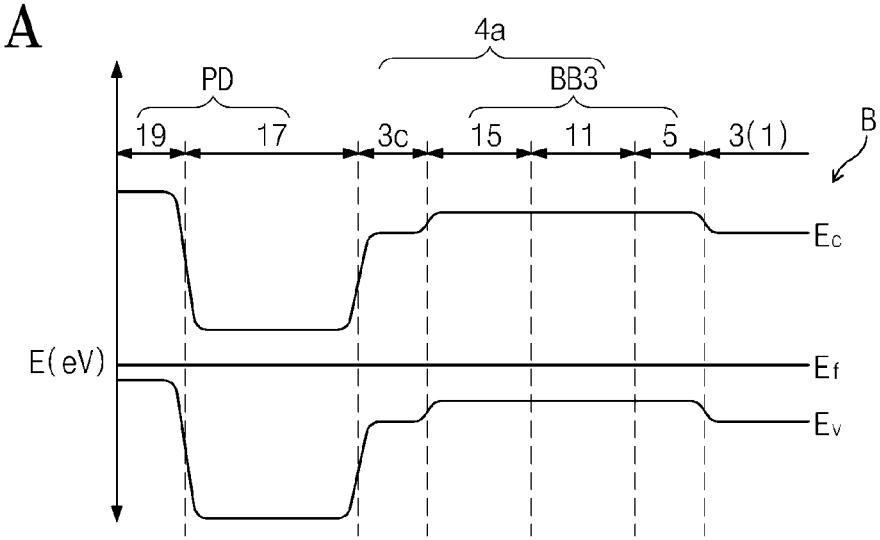
FIGS. 9A-9C are unified energy band diagrams illustrating potential energies of red, green and blue regions of FIG. 3.
Figure 9B:
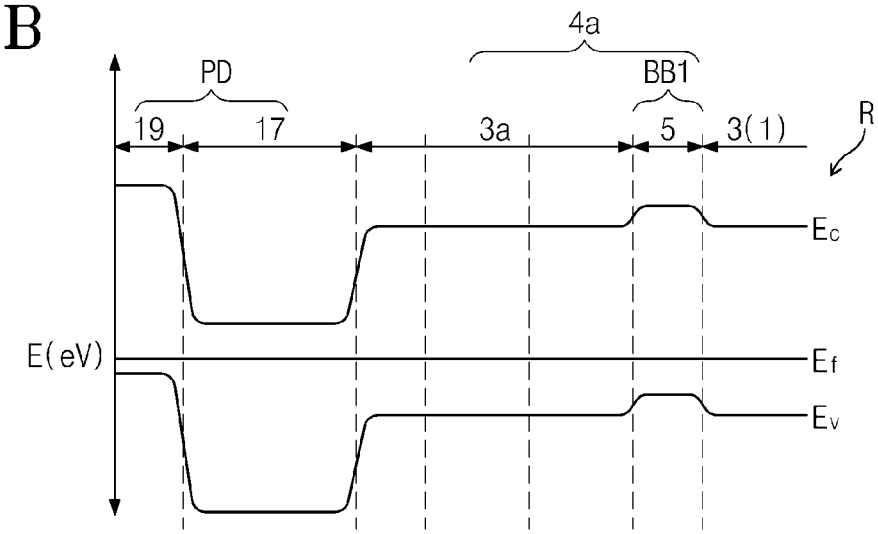
Figure 9C:
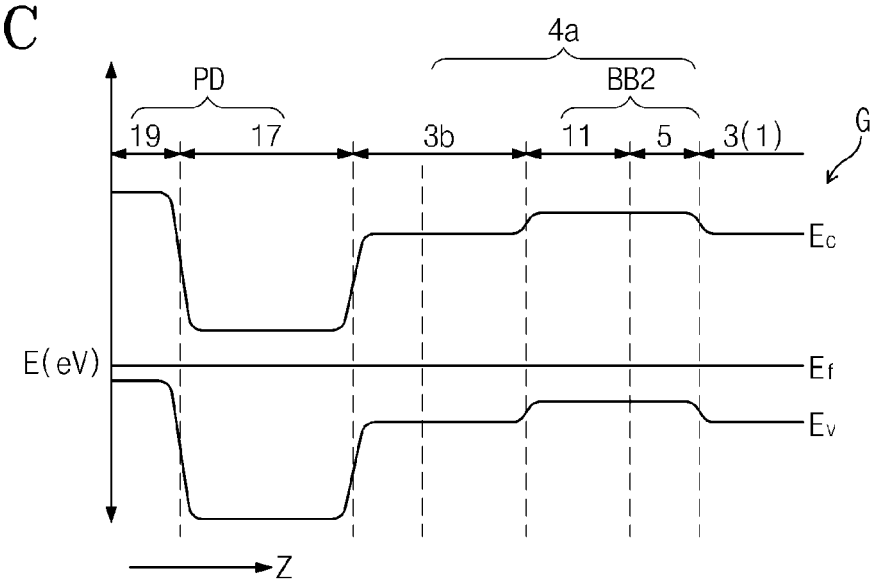

FIGS. 9A-9C are unified energy band diagrams illustrating potential energies of the red, green and blue regions R, G and B of FIG. 3.

Referring to FIGS. 3 and 9A-9C, the semiconductor substrate 1 may comprise a plurality of pixel regions including first to third pixel regions. In the present embodiment, the first to third pixel regions may correspond to the red, green and blue regions R, G and B, respectively. Further, each of the pixel regions R, G and B may include a pixel region buried barrier layer disposed in the semiconductor substrate 1, a first layer disposed at a main surface of the semiconductor substrate 1, and a second layer disposed between the first layer and the buried barrier layer.

In one embodiment, the first layers of the first to third pixel regions R, G and B may correspond to the first impurity implantation region 19 illustrated with reference to FIG. 3. That is, the first layers of the first to third pixel regions R, G and B may have a first conductivity type such as a P-type, and the first impurity implantation regions 19 in the first to third pixel regions R, G and B may have a same thickness in a vertical direction (i.e., a Z-direction of FIG. 3) which is perpendicular to the main surface of the semiconductor substrate 1. In addition, the first impurity implantation regions 19 in the first to third pixel regions R, G and B may have a same impurity concentration.

The pixel region buried barrier layer may comprise a first pixel region buried barrier layer BB1 in the first pixel region R, a second pixel region buried barrier layer BB2 in the second pixel region G, and a third pixel region buried barrier layer BB3 in the third pixel region B. The first pixel region buried barrier layer BB1 may include only the first buried barrier layer 5 and the second pixel region buried barrier layer BB2 may include the first and second buried barrier layers 5 and 11. Moreover, the third pixel region buried barrier layer BB3 may include the first to third buried barrier layers 5, 11 and 15. Therefore, the first to third pixel region buried barrier layers BB1, BB2 and BB3 may have different thicknesses from each other in the vertical direction. Alternatively, the first to third pixel region buried barrier layers BB1, BB2 and BB3 may have a same thickness. For example, each of the first to third pixel region buried barrier layers BB1, BB2 and BB3 may include only a single layer of the first to third buried barrier layers 5, 11 and 15. In one embodiment, the first to third pixel region buried barrier layers BB1, BB2 and BB3 are of the first conductivity type.

Each of the second layers of the first to third pixel regions R, G and B may comprise the second impurity implantation region 17 illustrated with reference to FIG. 3. That is, the second impurity implantation layers 17 of the first to third pixel regions R, G and B may have a second conductivity type such as N-type, and the second impurity implantation regions 17 in the first to third pixel regions R, G and B may have a same thickness in the vertical direction. Further, the second impurity implantation regions 17 in the first to third pixel regions R, G and B may have a same impurity concentration. The first and second impurity implantation layers 19 and 17 in each of the first to third pixel regions R, G and B may constitute a photo diode PD.

In one embodiment, the second layer in the first pixel region R may further comprise a first buffer layer 3a disposed between the second impurity implantation layers 17 and the first pixel region buried barrier layer BB1, and the second layer in the second pixel region G may further comprise a second buffer layer 3b disposed between the second impurity implantation layers 17 and the second pixel region buried barrier layer BB2. Similarly, the second layer in the third pixel region B may further comprise a third buffer layer 3c disposed between the second impurity implantation layers 17 and the third pixel region buried barrier layer BB3. That is, the second layer of the first pixel region R may comprise the second impurity implantation layer 17 and the first buffer layer 3a, and the second layer of the second pixel region G may comprise the second impurity implantation layer 17 and the second buffer layer 3b. Similarly, the second layer of the third pixel region B may comprise the second impurity implantation layer 17 and the third buffer layer 3c. The first to third buffer layers 3a, 3b and 3c may correspond to the epitaxial layer 3 illustrated with reference to FIG. 3. That is, the first to third buffer layers 3a, 3b and 3c may have the same conductivity type as the first to third pixel region buried barrier layers BB1, BB2 and BB3. In this case, an impurity concentration of the first to third pixel region buried barrier layers BB1, BB2 and BB3 may be higher than that of the first to third buffer layers 3a, 3b and 3c. Each of the first to third buffer layers 3a, 3b and 3c may also have a thickness in the vertical direction. The first to third buffer layers 3a, 3b and 3c and the first to third pixel region buried barrier layers BB1, BB2 and BB3 may constitute a single impurity layer 4a, as illustrated in FIGS. 9A-9C.

In one embodiment, a red light, a green light and a blue light may be irradiated onto the photo diodes PD in the first, second and third regions R, G and B, respectively. A wavelength of the red light is longer than that of the green light, and a wavelength of the green light is greater than that of the blue light. Thus, the thickness of the first buffer layer 3a may be greater than that of the second buffer layer 3b, and the thickness of the second buffer layer 3b may be greater than that of the third buffer layer 3c. This is for preventing the crosstalk between the adjacent pixels as set forth above. As a result, the thickness of the second layer in the first pixel region R is greater than the thickness of the second layer in the second pixel region G, and the thickness of the second layer in the second pixel region G is greater than the thickness of the second layer in the third pixel region B. That is, the thickness of the second layer may be thicker as the wavelength of the incident light is longer. For example, the thickness of the first to third buffer layers 3a, 3b or 3c is thicker as the wavelength is longer while the thickness of the second impurity layer 17 has a constant value regardless of the wavelength.

FIGS. 9A-9C illustrate energy band diagrams of the first, second and third pixel region buried barrier layers at a thermal equilibrium state. Thus, Fermi levels "$E_f$" of all the layers are the same level as illustrated in FIGS. 9A-9C. In addition, it is assumed that all the layers are the same semiconductor layers for the purpose of ease and simplification of the description. For example, all the layers may be a silicon layer having a band gap energy of about 1.1 electron volts (eV). In FIGS. 9A-9C, the reference symbols "$E_c$" and "$E_v$" indicate a conduction band and a valence band, respectively.

Referring again to FIGS. 9A-9C, the first layer 19 of the respective pixel regions R, G and B may have a first potential energy at a conduction band $E_c$ thereof, and the second layer of the respective pixel regions R, G and B may have a second potential energy at a conduction band $E_c$ thereof. Similarly, the first pixel region buried barrier layer BB1, the second pixel region buried barrier layer BB2 or the third pixel region buried barrier layer BB3 of the respective pixel regions R, G and B may have a barrier potential energy at a conduction band E thereof. When the first impurity implantation layer 19 and the single impurity layer 4a are P-type and the second impurity implantation layer 17 is N-type as described above, the second potential energy is higher than the first potential energy and the barrier potential energy as illustrated in FIGS. 9A-9C.

Figure 10:
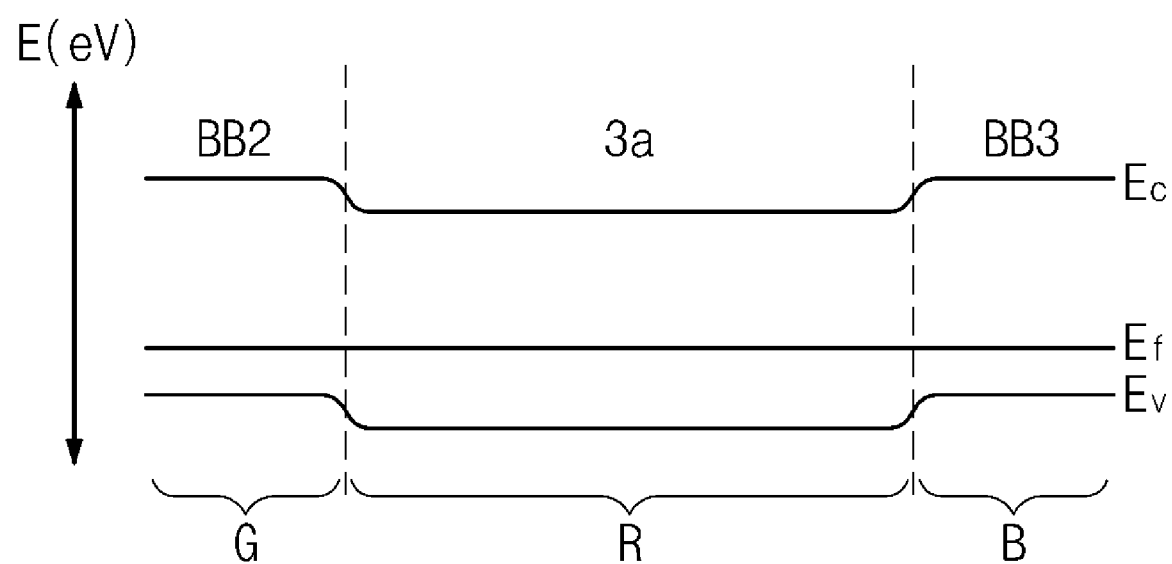
FIG. 10 is an energy band diagram taken along a line II-II' of FIG. 3.

FIG. 10 is an energy band diagram taken along a line II-II' of FIG. 3 to illustrate a potential energy profile of the single impurity layer. FIG. 10 also illustrates the energy band diagram at a thermal equilibrium state. In FIG. 10, the line II-II' is parallel to a main surface of the semiconductor substrate 1. That is, the line II-II' is parallel to an X-axis (e.g., a horizontal axis) in FIG. 3. In this embodiment, the first buffer layer 3a may correspond to a first portion of the single impurity layer 4a which is located between the photo diode PD and the first pixel region buried barrier layer BB1, and the second buffer layer 3b may correspond to a second portion of the single impurity layer 4a which is located between the photo diode PD and the second pixel region buried barrier layer BB2. Similarly, the third buffer layer 3c may correspond to a third portion of the single impurity layer 4a which is located between the photo diode PD and the third pixel region buried barrier layer BB3.

Referring again to FIGS. 3, 9A-9C and 10, the line II-II' passes through the first buffer layer 3a, the second pixel region buried barrier layer BB2 and the third pixel region buried barrier layer BB3. Thus, the potential energy profile of the single impurity layer 4a along the line II-II' may be non-uniform, as illustrated in FIG. 10. For example, the potential energy at the conduction band $E_c$ of the first portion 3a of the single impurity layer 4a may be higher than the potential energy at the conduction band $E_c$ of the second pixel region buried barrier layer BB2. Further, the potential energy at the conduction band $E_c$ of the first portion 3a of the single impurity layer 4a may also be higher than the potential energy at the conduction band $E_c$ of the third pixel region buried barrier layer BB3. This is because an impurity concentration of the first to third pixel region buried barrier layers BB1, BB2 and BB3 is higher than an impurity concentration of the first portion 3a of the single impurity layer 4a.

Figure 11:
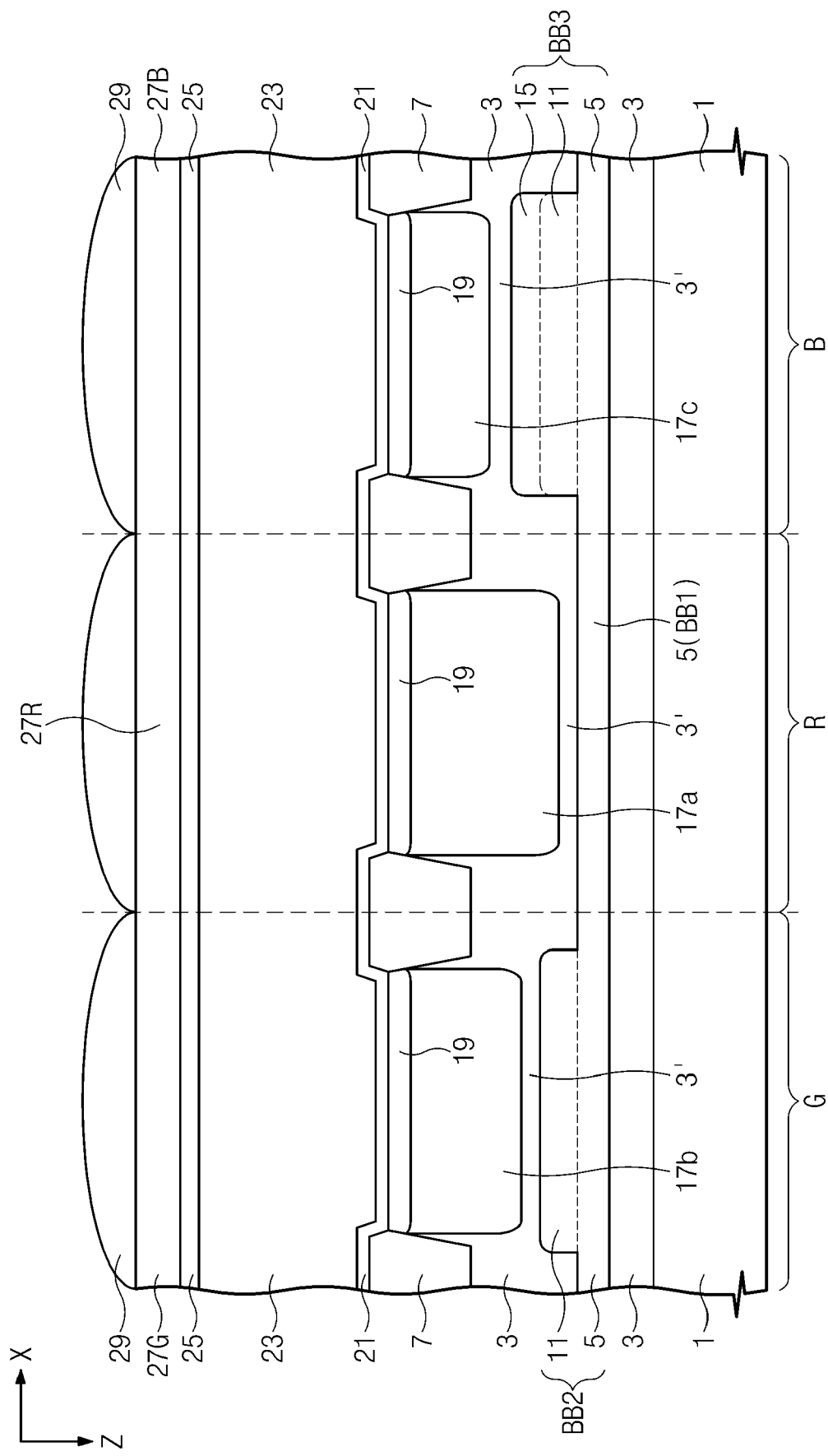
FIG. 11 is a cross sectional view of an image sensor according to another embodiment of the present invention which is taken along a line I-I' of FIG. 2.
Figure 12A:
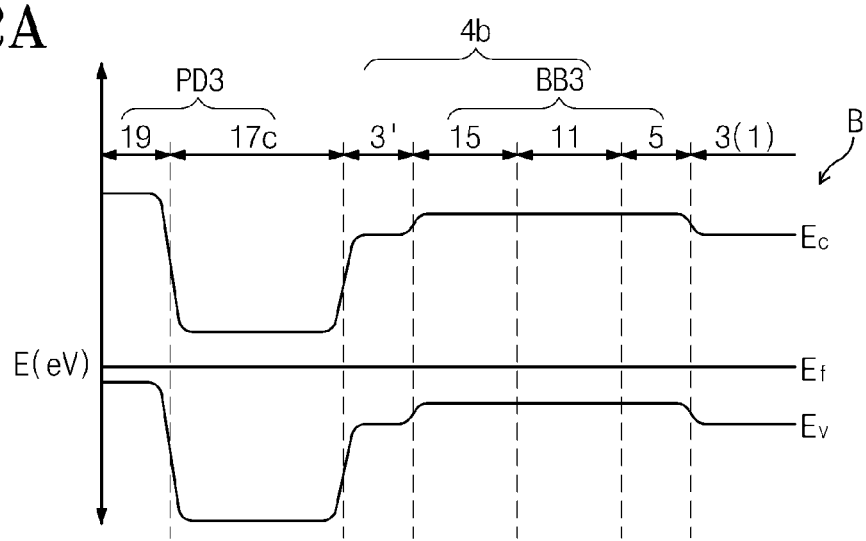
FIGS. 12A-12C are unified energy band diagrams illustrating potential energies of red, green and blue regions of FIG. 11.
Figure 12B:
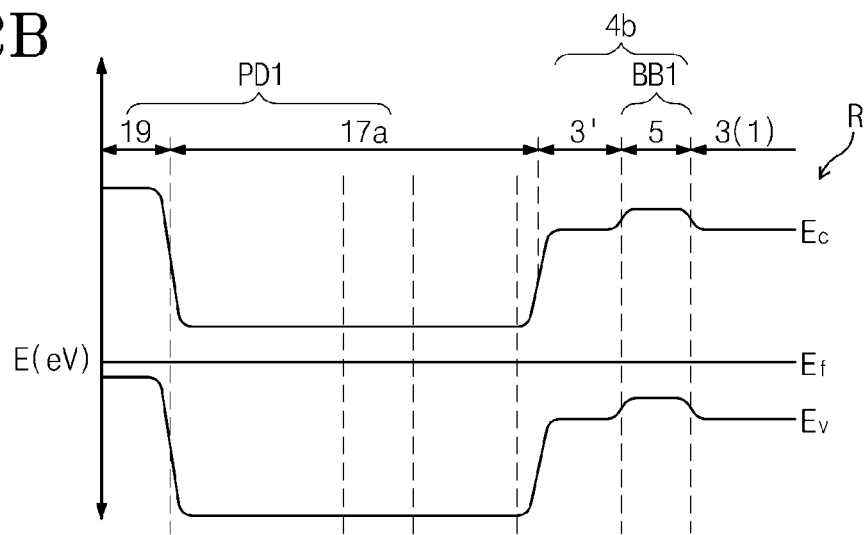
Figure 12C:
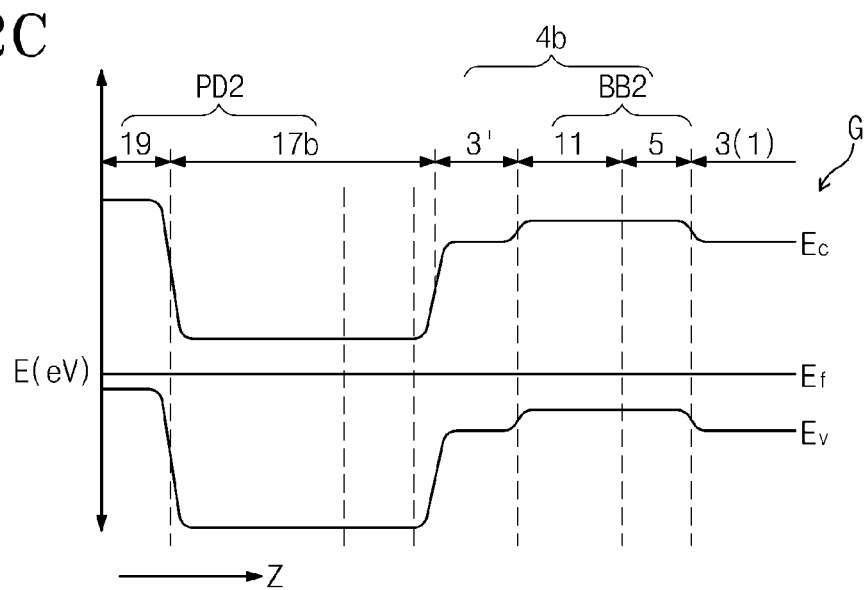

FIG. 1l is a cross sectional view of an image sensor according to another embodiment of the present invention which is taken along a line I-I' of FIG. 2, and FIGS. 12A-12C are unified energy band diagrams illustrating potential energies of red, green and blue regions of FIG. 11. This embodiment is different from the previous embodiment illustrated in FIGS. 3 and 9A-9C in terms of only thicknesses of the photo diodes and the buffer layers. FIGS. 12A-12C also illustrate the energy band diagrams at a thermal equilibrium state, and it is assumed that all the layers are the same semiconductor layers such as silicon layers.

Referring to FIGS. 11 and 12A-12C, the photo diodes may comprise a first photo diode PD1 in the first pixel region R, a second photo diode PD2 in the second pixel region G and a third photo diode PD3 in the third pixel region B. The first photo diode PD1 may comprise the first impurity implantation layer 19 of the first conductivity type and a second impurity implantation layer 17a of the second conductivity type, and the second photo diode PD2 may comprise the first impurity implantation layer 19 of the first conductivity type and a second impurity implantation layer 17b of the second conductivity type. Similarly, the third photo diode PD3 may comprise the first impurity implantation layer 19 of the first conductivity type and a second impurity implantation layer 17c of the second conductivity type. The second impurity implantation layers 17a, 17b and 17c may have different thicknesses from each other as illustrated in FIG. 11. For example, the thickness of the second impurity implantation layer 17a in the first pixel region R may be greater than that of the second impurity implantation layer 17b in the second pixel region G, and the thickness of the second impurity implantation layer 17b in the second pixel region G may be greater than that of the second impurity implantation layer 17c in the third pixel region B.

A thickness of a first buffer layer 3' between the first photo diode PD1 and the first pixel region buried barrier layer BB1 may be equal to a thickness of a second buffer layer 3' between the second photo diode PD2 and the second pixel region buried barrier layer BB2, and the thickness of the second buffer layer 3' between the second photo diode PD2 and the second pixel region buried barrier layer BB2 may be equal to a thickness of a third buffer layer 3' between the third photo diode PD3 and the third pixel region buried barrier layer BB3. The second impurity implantation layer 17a and the first buffer layer 3' in the first pixel region R may constitute a second layer of the first pixel region R, and the second impurity implantation layer 17b and the second buffer layer 3' in the second pixel region G may constitute a second layer of the second pixel region G. Further, the second impurity implantation layer 17c and the third buffer layer 3' in the third pixel region B may constitute a second layer of the third pixel region B. The buffer layers 3' and the first to third pixel region buried barrier layers BB1, BB2 and BB3 may constitute a single impurity layer 4b, as illustrated in FIGS. 12A-12C.

As a result, the thickness of the second layer in the first pixel region R is greater than that of the second layer in the second pixel region G, and the thickness of the second layer in the second pixel region G is greater than that of the second layer in the third pixel region B.

Referring again to FIGS. 12A-12C, the first layer 19 of the respective pixel regions R, G and B may have a first potential energy at a conduction band $E_c$ thereof, and the second layer of the respective pixel regions R, G and B may have a second potential energy at a conduction band $E_c$ thereof. Similarly, the first pixel region buried barrier layer BB1, the second pixel region buried barrier layer BB2 or the third pixel region buried barrier layer BB3 of the respective pixel regions R, G and B may have a barrier potential energy at a conduction band $E_c$ thereof. When the first impurity implantation layer 19 and the single impurity layer 4b are of the P-type and the second impurity implantation layers 17a, 17b and 17c are of the N-type as described above, the second potential energy is higher than the first potential energy and the barrier potential energy as illustrated in FIGS. 12A-12C.

Figure 13:
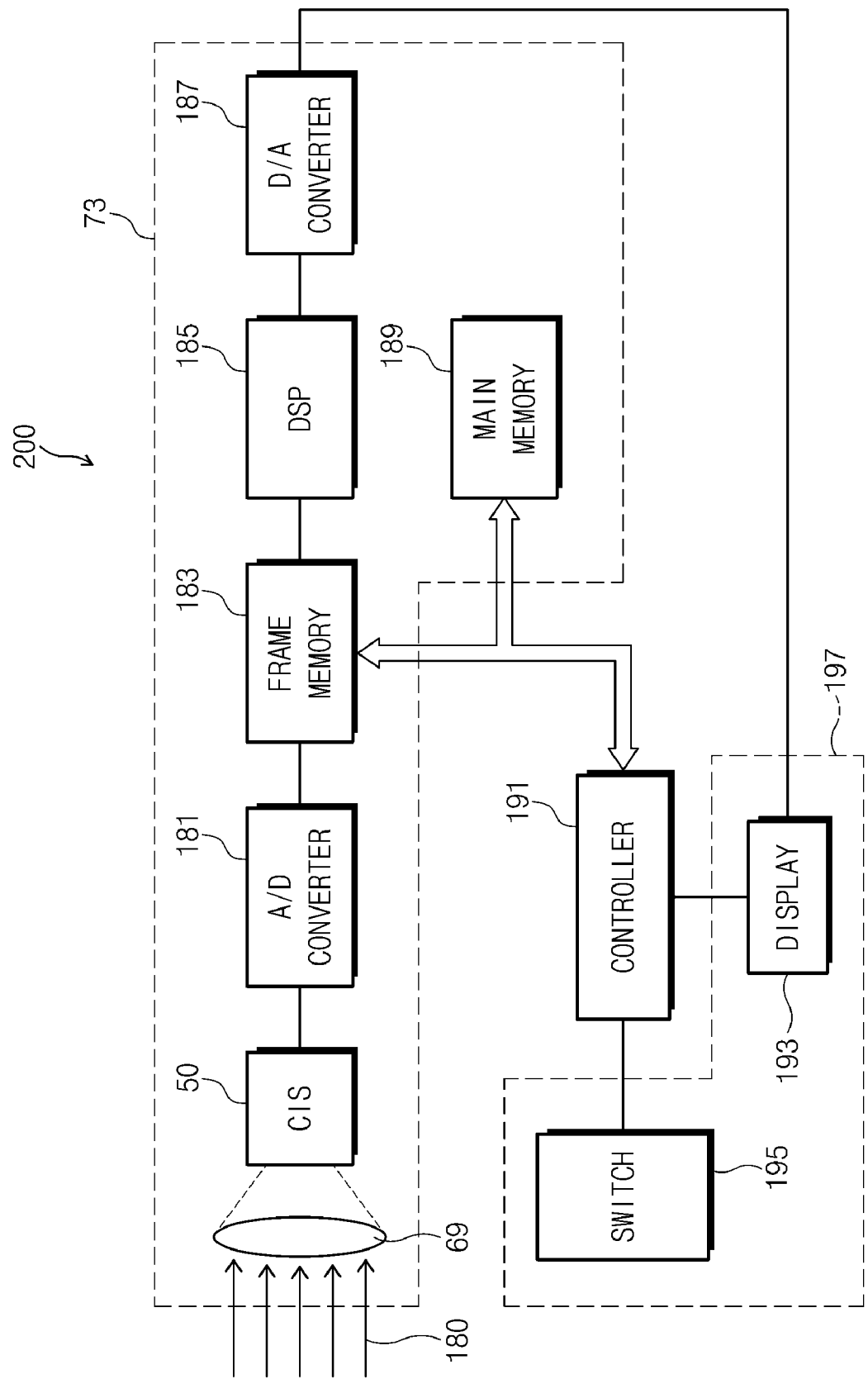
FIG. 13 is a schematic block diagram illustrating an electronic product employing one of the image sensors according to exemplary embodiments of the present invention.

FIG. 13 is a schematic block diagram illustrating an electronic product employing one of image sensors according to exemplary embodiments of the present invention.

Referring to FIG. 13, the electronic product 200 may comprise a controller 191, an image sensor module 73, and an input/output (I/O) module 197. The controller 191 may control operations of the image sensor module 73 and the I/O module 197. The image sensor module 73 may include an image sensing device 50, such as a CMOS image sensor (CIS) and the image sensing device 50 may include at least one of the image sensors illustrated in FIGS. 3 and 11. The image sensor module 73 may further include optical lens 69. External light 180 reflected from an object may pass through the optical lens 69 and may be irradiated onto the image sensing device 50. The image sensing device 50 may generate electrical image data which correspond to the object. The electrical image data generated from the image sensing device 50 may be analog data.

The image sensor module 73 may further include at least one non-memory semiconductor device and at least one memory device. For example, the image sensor module 73 may include an A/D converter 181 coupled to output terminals of the image sensing device 50, a frame memory 183 coupled to output terminals of the A/D converter 181, a digital signal processor (DSP) 185 coupled to I/O terminals of the frame memory 183, a D/A converter 187 coupled to output terminals of the DSP 185, and a main memory 189 coupled to the frame memory 183 and the controller 191. In this case, the controller 191 may control the operations of the frame memory 183 and the main memory 189.

The I/O module 197 may include a switch unit 195 and a display unit 193. The switch unit 195 may provide input data regarding the operations of the image sensor module 73 and the controller 191, and the display unit 193 may convert output data generated from the image sensor module 73 into visual image data.

The A/D converter 181 may convert the electrical image data generated from the image sensing device 50 into digital data. The digital data generated from the A/D converter 181 may be temporarily stored in the frame memory 183. The digital data stored in the frame memory 183 may be appropriately processed by the DSP 185, and the D/A converter 187 may convert output data of the DSP 185 into analog data. The analog data of the D/A converter 187 may be transmitted to the display unit 193 of the I/O module 197, and the display unit 193 may convert the analog data generated from the D/A converter 187 into visual image data and may exhibit the visual image data on a screen.

The digital data temporarily stored in the frame memory 183 may be recorded in the main memory 189 by the controller 191. The digital data in the main memory 189 may also be converted into analog data through the frame memory 183, the DSP 185 and the D/A converter 187, and the display unit 193 may exhibit visual images which correspond to the analog data of the D/A converter 187. The visual images corresponding to the digital data in the main memory 189 may be displayed on a screen of the display unit 193 at any time by operating the switch unit 195.

The electronic product 200 described above may be a digital camera. That is, the image sensors according to the embodiments of the present invention may be employed in the digital camera. However, the electronic product 200 may not be limited to the digital camera. That is, the image sensors according to the present invention may be applied to various electronic products other than the digital camera. For example, the image sensors according to the present invention may be employed in a mobile phone, a personal computer camera, or the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A CMOS image sensor including a plurality of pixels associated with colors of different wavelengths, each of the pixels comprising:

a buried barrier layer disposed in a semiconductor substrate, the buried barrier layer having a barrier potential energy of a conduction band thereof at an equilibrium state;

a first layer disposed at a main surface of the semiconductor substrate and separated from the buried barrier layer in a vertical direction which is perpendicular to the main surface of the semiconductor substrate, the first layer having a first potential energy of a conduction band thereof at the equilibrium state; and a second layer disposed between the first layer and the buried barrier layer, the second layer having a second potential energy of a conduction band thereof at the equilibrium state, wherein the second potential energy is higher than the first potential energy and the barrier potential energy, and wherein each of the first and second layers has a thickness in the vertical direction, and the thickness of the second layer is thicker as the wavelength is longer.

2. The CMOS image sensor of claim 1, wherein the first layer comprises a first impurity layer of a first conductivity type, wherein the second layer comprises a second impurity layer of a second conductivity type, and wherein the buried barrier layer is of the first conductivity type.

3. The CMOS image sensor of claim 2, wherein the first impurity layer and the second impurity layer constitute a photo diode.

4. The CMOS image sensor of claim 2, wherein the thickness of the second impurity layer is thicker as the wavelength is longer.

5. The CMOS image sensor of claim 2, wherein the first and second conductivity types are P-type and N-type, respectively.

6. The CMOS image sensor of claim 2, wherein the second layer further comprises a buffer layer between the second impurity layer and the buried barrier layer, and wherein the buffer layer is of the first conductivity type.

7. The CMOS image sensor of claim 6, wherein an impurity concentration of the buffer layer is lower than that of the buried barrier layer.

8. The CMOS image sensor of claim 6, wherein the thickness of the second impurity layer is thicker as the wavelength is longer while the thickness of the buffer layer has a constant value regardless of the wavelength.

9. The CMOS image sensor of claim 6, wherein the thickness of the buffer layer is thicker as the wavelength is longer while the thickness of the second impurity layer has a constant value regardless of the wavelength.

10. A CMOS image sensor comprising:
a semiconductor substrate having a plurality of pixel regions;
a single impurity layer in the semiconductor substrate, the single impurity layer including a plurality of buried barrier layers which are disposed in the plurality of the pixel regions respectively; and
a plurality of photo diodes formed in the single impurity layer and located over the buried barrier layers respectively, each of the photo diodes is separated from the corresponding buried barrier layer to leave a portion of the single impurity layer between the photo diode and the corresponding buried barrier layer,
wherein the single impurity layer in at least two adjacent pixel regions among the plurality of pixel regions has a non-uniform potential energy profile along a horizontal axis parallel to a main surface of the semiconductor substrate.

11. The CMOS image sensor of claim 10, wherein the at least two adjacent pixel regions comprises a first pixel region and a second pixel region, and wherein the horizontal axis passes through a portion of the single impurity layer of the first pixel region and the buried barrier layer of the second pixel region.

12. The CMOS image sensor of claim 10, wherein each of the photo diodes comprises a first impurity layer of a first conductivity type formed at the main surface of the semiconductor substrate and a second impurity layer of a second conductivity type disposed beneath the first impurity layer.

13. The CMOS image sensor of claim 12, wherein the first conductivity type and the second conductivity type are P-type and N-type, respectively.

14. The CMOS image sensor of claim 12, wherein the single impurity layer including the buried barrier layers is of the first conductivity type, and wherein an impurity concentration of the buried barrier layers is higher than that of the portion of the single impurity layer.

15. The CMOS image sensor of claim 10, wherein the pixel regions comprise a first pixel region on which a first light is irradiated and a second pixel region on which a second light is irradiated, and wherein a wavelength of the first light is longer than that of the second light.

16. The CMOS image sensor of claim 15, wherein a potential energy of the single impurity layer of the first pixel region is higher than a potential energy of the single impurity layer of the second pixel region.

17. The CMOS image sensor of claim 15, wherein the plurality of photo diodes have a same thickness in a vertical direction which is perpendicular to the main surface of the semiconductor substrate.

18. The CMOS image sensor of claim 15, wherein the single impurity layer in each of the pixel regions comprises a thickness in the vertical direction, and wherein the thickness of the single impurity layer in the second pixel region is greater than the thickness of the single impurity layer in the first pixel region.

19. An electronic product comprising:
an image sensor module including an image sensor;
a controller coupled to the image sensor module, the controller controlling an operation of the image sensor module; and
an input/output module coupled to the controller, the input/output module providing input data regarding the operation of the image sensor module and displaying output data from the image sensor module,
wherein the image sensor comprises:
a buried barrier layer disposed in the semiconductor substrate, the buried barrier layer having a barrier potential energy of a conduction band thereof at an equilibrium state;
a first layer disposed at a main surface of the semiconductor substrate and separated from the buried barrier layer in a vertical direction which is perpendicular to the main surface of the semiconductor substrate, the first layer having a first potential energy of a conduction band thereof at the equilibrium state; and
a second layer disposed between the first region and the buried barrier layer, the second layer having a second potential energy of a conduction band thereof at the equilibrium state,
wherein the second potential energy is higher than the first potential energy and the barrier potential energy, and wherein each of the first and second layers has a thickness in the vertical direction, and the thickness of the second layer is thicker as the wavelength is longer.

20. An electronic product comprising:
an image sensor module including an image sensor;
a controller coupled to the image sensor module, the controller controlling an operation of the image sensor module; and
an input/output module coupled to the controller, the input/output module providing input data regarding the operation of the image sensor module and displaying output data from the image sensor module,
wherein the image sensor comprises:
a semiconductor substrate having a plurality of pixel regions;
a single impurity layer in a semiconductor substrate, the single impurity layer including a plurality of buried barrier layers which are disposed in the plurality of the pixel regions respectively; and
a plurality of photo diodes formed in the single impurity layer and located over the buried barrier layers respectively, each of the photo diodes is separated from the corresponding buried barrier layer to leave a portion of the single impurity layer between the photo diode and the corresponding buried barrier layer, wherein the single impurity layer in at least two adjacent pixel regions among the plurality of pixel regions has a non-uniform potential energy profile along a horizontal axis parallel to a main surface of the semiconductor substrate.

* * * * *